United States Patent [19]

Fowler

[11] 3,944,813
[45] Mar. 16, 1976

[54] PHOTOELECTRIC CONTROL CIRCUIT FOR DIGITAL MAGNETIC COMPASS

[75] Inventor: John T. Fowler, Winthrop, Mass.

[73] Assignee: The Laitram Corporation, New Orleans, La.

[22] Filed: Aug. 8, 1974

[21] Appl. No.: 495,849

[52] U.S. Cl. .......................... 250/205; 250/231 SE
[51] Int. Cl.² ...................... G01D 5/34; G01J 1/32
[58] Field of Search ...... 250/205, 555, 570, 231 SE; 340/347 P, 146.3 AG

[56] References Cited
UNITED STATES PATENTS
3,746,842  7/1973  Fowler .................. 340/347 P X OTHER PUBLICATIONS
IBM Technical Disclosure Bulletin, Thomas et al., "Digital Feedback Light–Emitting Diode Control," 1/1974, Vol, 16, No. 8, pp. 2598–2600.

*Primary Examiner*—Thomas J. Sloyan
*Attorney, Agent, or Firm*—Weingarten, Maxham & Schurgin

[57]  ABSTRACT

For use in an electro-optically sensed magnetic compass a photoelectric control circuit in which the duty cycle of the illumination source is varied to energize the source only until a valid electrical output signal is detected.

5 Claims, 7 Drawing Figures

U.S. Patent    March 16, 1976    3,944,813
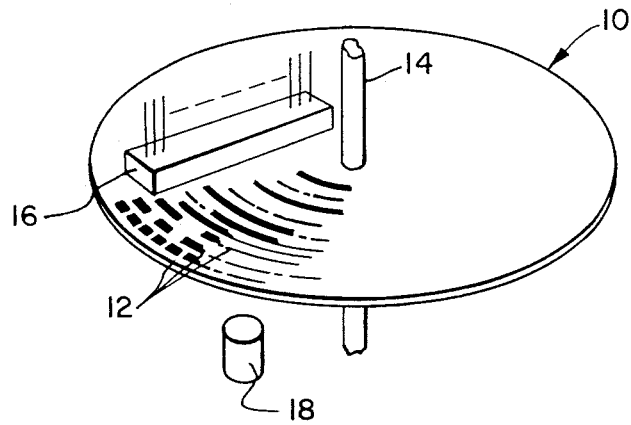
FIG. 1
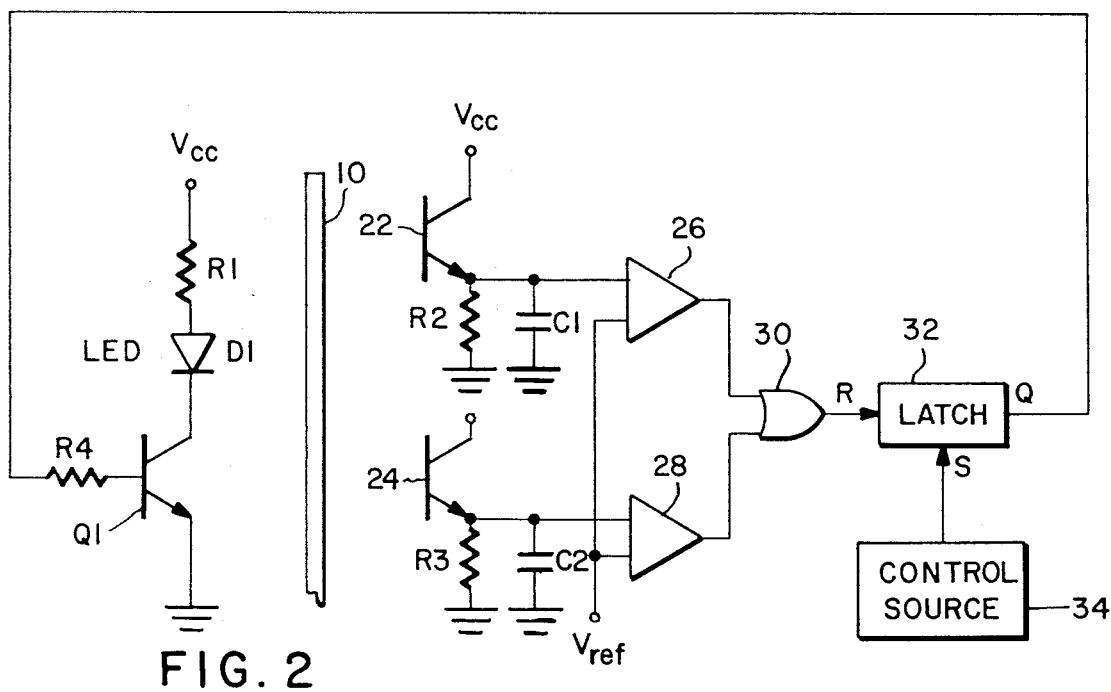
FIG. 2
FIG. 3A  CONTROL 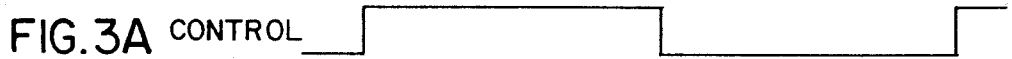
FIG. 3B  Q 
FIG. 3C  I 
FIG. 3D  $V_{ref}$ / $V_{pt}$ 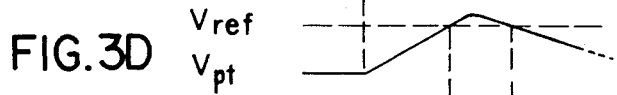
FIG. 3E  R 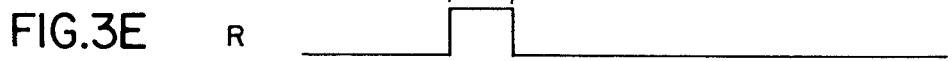

PHOTOELECTRIC CONTROL CIRCUIT FOR DIGITAL MAGNETIC COMPASS

FIELD OF THE INVENTION

This invention relates to electro-optically sensed digital magnetic compasses and more particularly to a photoelectric control circuit therefor.

BACKGROUND OF THE INVENTION

A digital magnetic compass is shown in copending U.S. patent application Ser. No. 284,362, filed Aug. 28, 1972, wherein compass headings are optically coded on a plurality of tracks of a compass disc which is electro-optically sensed to provide electrical output signals representative of compass heading. It is useful to employ the minimum electrical energy necessary to energize the light source associated with the compass disc sensing apparatus, since such energy for providing illumination is a major portion of that required for compass operation.

SUMMARY OF THE INVENTION

In brief, the invention provides an electro-optically sensed magnetic compass in which the duty cycle of the illumination source is selectively varied to provide illumination only until a valid electrical output signal is provided for sensing of the coded compass heading. The compass includes an illumination source, typically a light emitting diode, which transmits light through the coded tracks of the compass disc and one or more transparent control tracks thereof. Light is sensed by respective light sensors each associated with a respective track of the compass disc to provide corresponding electrical output signals. One or more of the light sensors, usually those associated with the transparent control tracks, are coupled to a threshold circuit which provides a digital output signal having a first amplitude in response to a received signal less than a predetermined threshold level and a second amplitude in response to a received signal equal to or greater than the predetermined threshold level. The digital output signal controls a latch circuit which drives the illumination source such that the source is energized only for a time sufficient to assure provision of a valid light sensor signal at least equal to the threshold level. Upon detection of a valid sensor signal, the illumination source is de-energized to thus conserve power.

DESCRIPTION OF THE DRAWINGS

The invention will be more fully understood from the following detailed description taken in conjunction with the accompanying drawings, in which:

FIG. 1 is a diagrammatic representation of a digital magnetic compass with which the invention is useful;

FIG. 2 is a schematic representation of a control circuit embodying the invention; and FIGS. 3A–3E are waveform diagrams useful in explaining operation of the invention.

DETAILED DESCRIPTION OF THE INVENTION

Referring to FIG. 1, there is shown in diagrammatic form a digital magnetic compass of the type with which the invention is especially useful. Such a compass is shown for example in the aforesaid copending patent application. The compass includes a transparent disc 10 having a plurality of concentric tracks each having a different number of alternately transmissive and opaque segments 12 defining codes representative of compass headings. A compass magnet 14 is affixed to and rotatable with disc 10. An array of photosensors 16 is disposed typically along a radius of disc 10 with a sensing cell associated with each coded track of the compass disc. An illumination source, such as a light emitting diode 18, is disposed on the opposite surface of disc 10 from array 16 and is operative to illuminate the coded tracks, the light being transmitted by the transparent segments of the coded tracks being received by the sensor array 16. For different angular positions of disc 10 with respect to array 16, the array provides a plurality of output signals correspondingly coded to represent the angular disc position and therefore also representative of compass heading. The output signals are processed by suitable electronic circuitry to provide an output indication of compass heading sensed from disc 10. The electrical energy required to illuminate source 18 is a major portion of the total energy required for compass operation since in preferred implementation the electronic circuitry of the digital compass is of micro-circuit form requiring extremely little electrical power. According to the invention, source 18 is energized only for so long as necessary for receipt of a proper output signal from array 16.

The novel photoelectric control circuit is shown in FIG. 2. A light emitting diode D1 has its anode coupled to a source of operating potential $V_{cc}$ by way of a resistor R1 and its cathode connected to the collector of a transistor Q1 the emitter thereof being coupled to ground or other source of reference potential. The light emitting diode is arranged to transmit light through disc 10, the transmitted light being received by phototransistors 22 and 24. These phototransistors are associated with respective tracks of disc 10 such that at least one phototransistor always receives light from source 18. The collectors of phototransistors 22 and 24 are coupled to voltage source $V_{cc}$ while the emitters thereof are respectively coupled via respective resistors R2 and R3 to ground. Respective capacitors C1 and C2 are provided in shunt with respective resistors R2 and R3. The emitter of phototransistor 22 is coupled to an input of a comparator 26, while the emitter of phototransistor 24 is coupled to the input of a second digital comparator 28. A reference signal is applied to both comparators 26 and 28 from a suitable source $V_{ref}$. The output of the comparators is coupled via an OR gate 30 to an input of a latch circuit 32 which also receives a control signal from a control source 34. The output signal from latch circuit 32 is coupled via a resistor R4 to the base of switching transistor Q1.

Circuit operation will be described in conjunction with the waveform diagrams of FIGS. 3A–3E. A timing cycle is defined by a control signal shown in FIG. 3A provided by control source 34. The provision of a control signal to latch circuit 32 causes an output signal to be provided to the light emitting diode. This output signal, shown in FIG. 3B, causes energization of the light emitting diode for the duration of this latch output signal, as shown by the waveform of FIG. 3C depicting the current flowing while light emitting diode is energized. The threshold voltage $V_{ref}$ is depicted as a dotted line in FIG. 3D, while the output voltage $V_{pt}$ from the phototransistors 22 and 24 is shown in FIG. 3D as a rising voltage which exceeds the threshold level and which thereafter decays to a zero level. The digital comparators 26 and 28 each provide an output signal upon exceedance of the threshold $V_{ref}$ by the phototransistor signals, and these output signals are applied as a reset signal via OR gate 30 to latch circuit 32. This reset signal is shown in FIG. 3E. Resetting of the latch circuit causes discontinuance of the latch output signal thereby de-energizing the light emitting diode by switching off transistor Q1. During each control cycle defined by the duration of the control signal provided by source 34, the light emitting diode is energized until detection of a photosensor signal at least equal to the predetermined threshold level. Upon such detection, the light emitting diode is de-energized for the remainder of the operating cycle. Thus, the illumination source is energized only during a portion of each operating cycle and for only so long as is necessary to assure detection of a valid photosensor signal equal to or greater than the threshold level. Power is thereby conserved by minimizing the time duration for which the light emitting diode is energized.

In the embodiment of FIG. 2, two phototransistors are shown illuminated by a common light emitting diode. It will be appreciated that the invention is applicable to various light coupling arrangements. For example, a single light emitting diode or other illumination source can be associated with a corresponding photosensor, or a plurality of photosensors can receive light from a single illumination source.

In some instances, it may be desirable to energize the light emitting diode throughout an operating cycle but to vary the illumination in order to maintain a substantially uniform electrical output signal level. The embodiment of FIG. 2 can be modified to accomplish such gain control, by replacing the latch circuit 32 with a variable gain circuit such as a transistor amplifier which provides an output signal of amplitude variable in response to the magnitude of the phototransistor output signal.

The invention is not to be limited by what has been particularly shown and described except as indicated in the appended claims.

What is claimed is:

1. For use in a digital magnetic compass having a compass disc containing a plurality of optically coded representations of compass headings thereon, means for illuminating a selected portion of said disc, and photosensor means for providing electrical signals representative of compass headings, a photoelectric control circuit comprising:

an illumination source;
at least one photosensor receiving light from said source and through said disc;
comparator means receiving an electrical signal from said at least one photosensor and a reference voltage and providing a digital output signal of one level when said photosensor signal is less than said reference voltage and of another level when said photosensor signal is at least equal to said reference voltage; and
latch means operative in response to said digital output signal from said comparator means to provide an energizing signal to said illumination source from a start time until switching of said comparator means from said one level to said another level thereby to energize said illumination source only for a duration sufficient to permit detection of a photosensor signal at least equal to said reference voltage;
said latch means providing no energizing signal to said illumination source from said switching of said comparator means until the next start time.

2. The invention according to claim 1 wherein said illumination source includes:
a light emitting diode;
a switching transistor coupled to said light emitting diode and to said latch means for control of said light emitting diode.

3. The invention according to claim 1 wherein said at least one photosensor includes:
a plurality of photosensors each receiving light from said source and through said disc;
and wherein said comparator means includes a comparator for each of said photosensors and providing a respective digital output signal;
and further including an OR gate operative to couple said digital output signals to said latch means.

4. The invention according to claim 1 wherein said comparator means includes:
a comparator circuit having a predetermined threshold level determined in accordance with a reference voltage;
means for applying said reference voltage to said comparator circuit for establishment of said threshold level.

5. The invention according to claim 1 wherein said latch means includes:
a digital latch circuit for providing an energizing signal of uniform amplitude in response to an enable signal and for discontinuing provision of said energizing signal in response to a disable signal;
a signal source for providing to said latch circuit said enable signal for a predetermined time interval commencing at said start time;
said disable signal being said digital output signal of another level applied to said latch circuit upon transition of said digital output signal from said one level to said another level, thereby to discontinue provision of said energizing signal for the remainder of said predetermined time interval.

* * * * *